(12) United States Patent
Kambegawa

(10) Patent No.: US 9,077,839 B2
(45) Date of Patent: Jul. 7, 2015

(54) INFORMATION PROCESSING APPARATUS, CONTROL METHOD, AND STORAGE MEDIUM FOR SUPPRESSING A DECREASE IN PERFORMANCE DUE TO AN INCREASE IN MEMORY TEMPERATURE WHEN USING A WIDE IO MEMORY

(71) Applicant: CANON KABUSHIKI KAISHA, Tokyo (JP)

(72) Inventor: Minoru Kambegawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/042,890

(22) Filed: Oct. 1, 2013

(65) Prior Publication Data

US 2014/0098404 A1 Apr. 10, 2014

(30) Foreign Application Priority Data

Oct. 10, 2012 (JP) ................. 2012-225367

(51) Int. Cl.
*H04N 1/00* (2006.01)
*G06F 1/20* (2006.01)
*G06F 3/06* (2006.01)
*G11C 11/34* (2006.01)
*G11C 7/04* (2006.01)

(52) U.S. Cl.
CPC ............ *H04N 1/00912* (2013.01); *G06F 1/206* (2013.01); *H04N 1/00954* (2013.01); *H04N 1/00978* (2013.01); *H04N 2201/0094* (2013.01); *G06F 3/0602* (2013.01); *G11C 11/34* (2013.01); *Y02B 60/1275* (2013.01); *G11C 7/04* (2013.01)

(58) Field of Classification Search
USPC .................... 358/1.13, 1.14, 1.15, 1.16, 1.17; 713/323; 716/100, 119, 138
See application file for complete search history.

(56) References Cited

U.S. PATENT DOCUMENTS

| | | | | |
|---|---|---|---|---|
| 2003/0125896 A1* | 7/2003 | Charlton et al. | ............... | 702/118 |
| 2010/0100341 A1* | 4/2010 | Kim et al. | ........... | 702/62 |
| 2012/0018885 A1* | 1/2012 | Lee et al. | ........... | 257/738 |
| 2012/0030413 A1* | 2/2012 | Miyagawa et al. | ........... | 711/103 |
| 2012/0287731 A1* | 11/2012 | Kim | ............ | 365/189.07 |

* cited by examiner

*Primary Examiner* — Allen H Nguyen
(74) *Attorney, Agent, or Firm* — Carter, DeLuca, Farrell & Schmidt, LLP

(57) ABSTRACT

An information processing apparatus according to one aspect of the present invention includes a wide IO memory device stacked on an SoC die that includes a CPU, acquires temperature information of multiple memories in the wide IO memory device, loads applications for executing separate functions to multiple memories, excluding the memory positioned above the circuit on the SoC die related to the function to be executed by the application, and, when the execution of the loaded application is instructed, executes the application loaded to the memory having a lower temperature that was acquired.

12 Claims, 10 Drawing Sheets

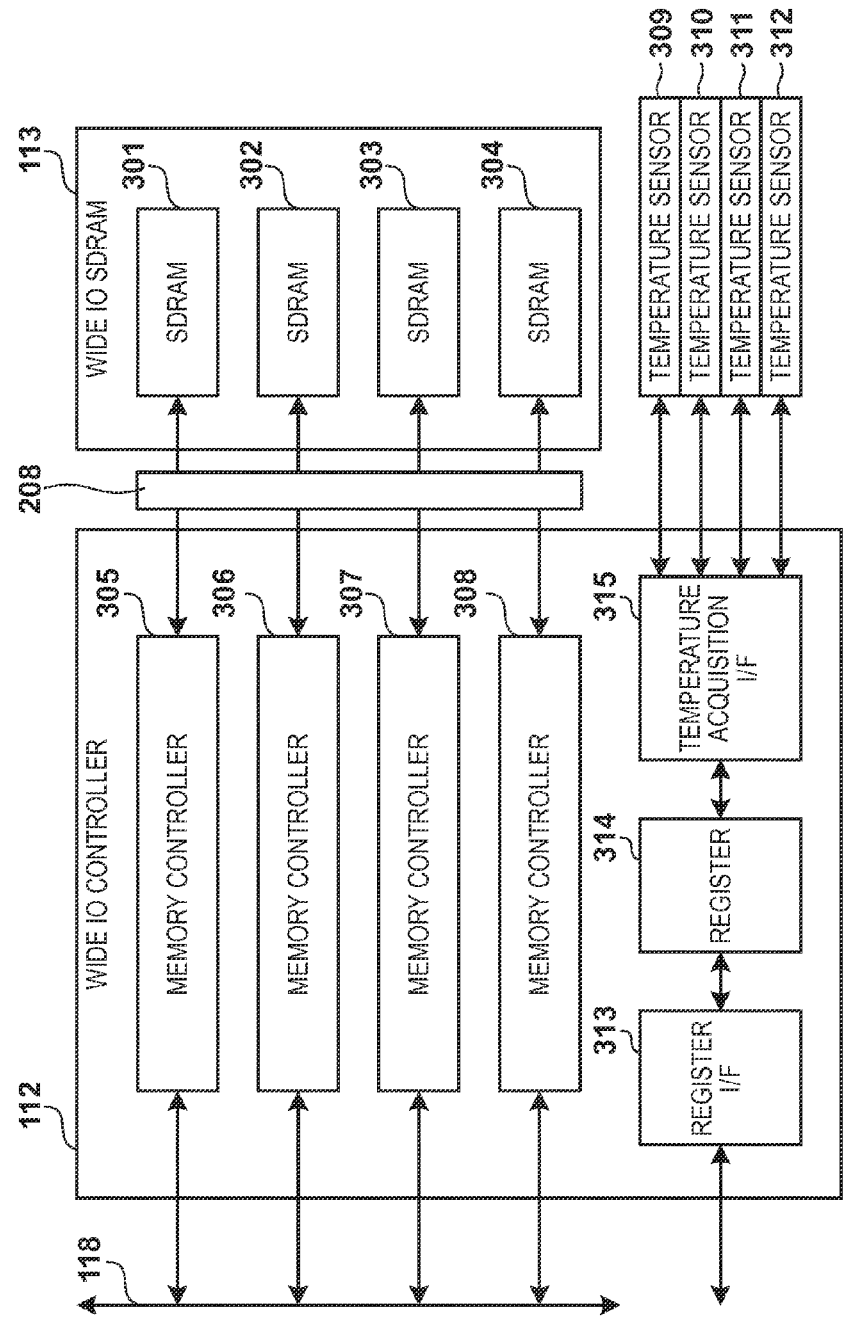

F I G. 6
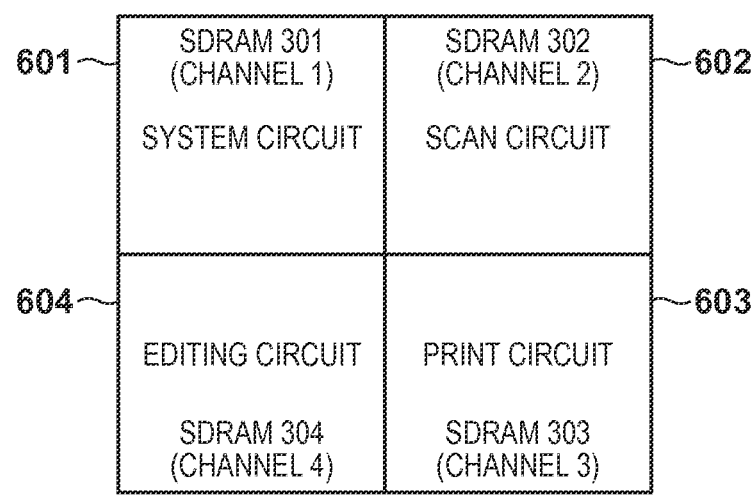

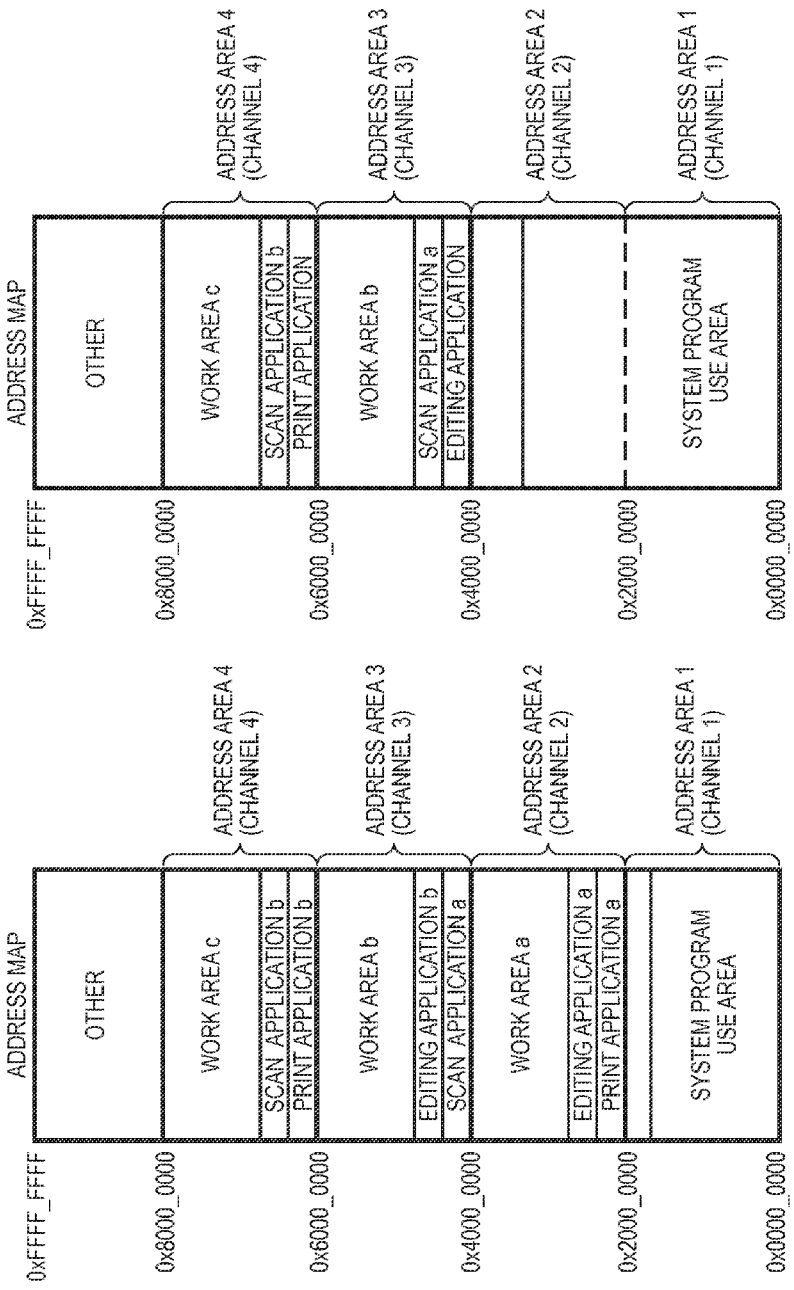

INFORMATION PROCESSING APPARATUS, CONTROL METHOD, AND STORAGE MEDIUM FOR SUPPRESSING A DECREASE IN PERFORMANCE DUE TO AN INCREASE IN MEMORY TEMPERATURE WHEN USING A WIDE IO MEMORY

BACKGROUND OF THE INVENTION

1. Field of the Invention

The present invention relates to an information processing apparatus including a wide IO memory device stacked on an SoC die that includes a CPU.

2. Description of the Related Art

In information processing apparatuses that include a CPU such as a microprocessor, a DRAM is often used for storage of data for executing an OS and various applications, and for temporary storage of data for executing image processing. The DRAM is connected to a CPU, an SoC (System on a Chip), or the like and used by them. Furthermore, in recent years, as functions have been added/enhanced in information processing apparatuses, the amount of memory bandwidth needed in DRAMs has increased. Because of this, the amount of memory bandwidth has been increased by raising the clock frequency during memory access, according to a standard such as DDR3 or DDR4. Furthermore, as another method, memory bandwidth is reserved by including multiple DRAM channels that are connected to a CPU or an ASIC (Application Specific Integrated Circuit). However, a new problem occurs in that increasing the clock frequency and employing multiple memory channels increases power consumption.

In view of this, wide IOs, which are a next-generation DRAM standard, are currently gaining attention. A wide IO is configured by placing a DRAM chip over an SoC die using a 3D stacking technique based on TSVs (Through-Silicon Vias). Features of the wide IO include being able to obtain a wide bandwidth that is over 12.8 GB/s (gigabytes per second) at most, with a wide data width of 512 bits, and having low power consumption due to the access frequency being suppressed to a low frequency. Also, by employing TSVs, the package size can be made thinner and smaller compared to a conventional PoP (Package on Package). Furthermore, as a countermeasure against heat caused by stacking memories in an SoC package, a temperature sensor that detects the memory temperature is built in, and the self-refresh rate is changed according to the detected temperature. Also, in this configuration, a data width of 512 bits is divided into four 128-bit channels and each channel is controlled individually. For example, a method of use is possible in which channel 1 and channel 2 are put in a self-refresh state, while channel 3 and channel 4 are used for normal memory access, or the like. A basic structure and basic access method for such a wide IO is disclosed in US Publication No. 2012/0018885.

The stacked structure of a wide IO is structurally susceptible to heat. For example, if a specific region of a SoC die and a DRAM chip of a wide IO placed on a layer above this specific region are activated at the same time, the temperature of the activated portions rises locally. Thus, it is necessary to shorten the DRAM refresh interval. Additionally, power consumption increases due to the influence of semiconductor leak current, which increases exponentially with respect to temperature. Furthermore, due to localized temperature increases in some areas of the DRAM, it is necessary to increase the refresh frequency of the entire DRAM, thus reducing the DRAM access performance. The performance of the system including the SoC package is reduced due to the decrease in DRAM access performance, which causes the product performance to be reduced.

SUMMARY OF THE INVENTION

In order to resolve the aforementioned problems in the conventional technology, the present invention provides a technique that enables the suppression of a decrease in performance due to an increase in memory temperature when using a wide. IO memory.

According to one aspect of the present invention, there is provided an information processing apparatus comprising: a wide IO memory device stacked on an SoC die that includes a CPU; a loading unit configured to load a specified application from among a plurality of applications for executing separate functions, to a plurality of memories included in the wide IO memory device, excluding a memory positioned above a circuit on the SoC die relating to the function executed by the application; a temperature acquisition unit configured to, upon the execution of the application loaded by the loading unit being instructed, acquire temperature information of the plurality of memories included in the wide IO memory device; and a control unit configured to perform control so as to execute the application loaded to a memory having a lower temperature acquired by the temperature acquisition unit.

According to another aspect of the present invention, there is provided a control method of controlling an information processing apparatus including a wide IO memory device stacked on an SoC die that includes a CPU, the method comprising steps of: loading a specified application from among a plurality of applications for executing separate functions, to a plurality of memories included in the wide IO memory device, excluding a memory positioned above a circuit on the SoC die relating to the function for executing the application; upon the execution of the application loaded in the loading step being instructed, acquiring temperature information of the plurality of memories included in the wide IO memory device; and performing control, so as to execute the application loaded to a memory having a lower temperature acquired in the acquiring step.

According to still another aspect of the present invention, there is provided a computer-readable storage medium storing a computer program for causing a computer to execute steps of a control method of controlling an information processing apparatus including a wide IO memory device stacked on an SoC die that includes a CPU, the method comprising steps of: loading a specified application from among a plurality of applications for executing separate functions, to a plurality of memories included in the wide IO memory device, excluding a memory positioned above a circuit on the SoC die relating to the function for executing the application; upon the execution of the application loaded in the loading step being instructed, acquiring temperature information of the plurality of memories included in the wide IO memory device; and performing control so as to execute the application loaded to a memory having a lower temperature acquired in the acquiring step.

An aspect of the present invention has an advantage of enabling the suppression of a decrease in performance due to an increase in memory temperature when using a wide IO memory.

Further features of the present invention will become apparent from the following description of exemplary embodiments (with reference to the attached drawings).

BRIEF DESCRIPTION OF THE DRAWINGS

FIG. 3 is a block diagram showing the internal configuration of a wide IO controller according to the first embodiment.

FIG. 6 is a diagram showing the positional relationship between SDRAMs that configure the wide IO SDRAM and circuits that are laid out on the SoC die, according to an embodiment.

FIG. 9A is a diagram showing an example in which a scan application, a print application, and an edit application are arranged in a memory in the case where there are three available channels.

FIG. 9B is a diagram showing an example in which the scan application, the print application, and the edit application are arranged in the memory in the case where there are two available channels.

DESCRIPTION OF THE EMBODIMENTS

Hereinafter, embodiments of the present invention will be described in detail with reference to the accompanying drawings. It should be noted that the following embodiments are not intended to limit the scope of the appended claims, and that not all the combinations of features described in the embodiments are necessarily essential to the solving means of the present invention.

It should be noted that an MFP (digital Multi-Function. Peripheral) having multiple functions such as scanning, printing, and copying will be described, in the embodiments below as an example of an information processing apparatus that includes a wide IO according to the present embodiment.

First Embodiment

Figure 1:
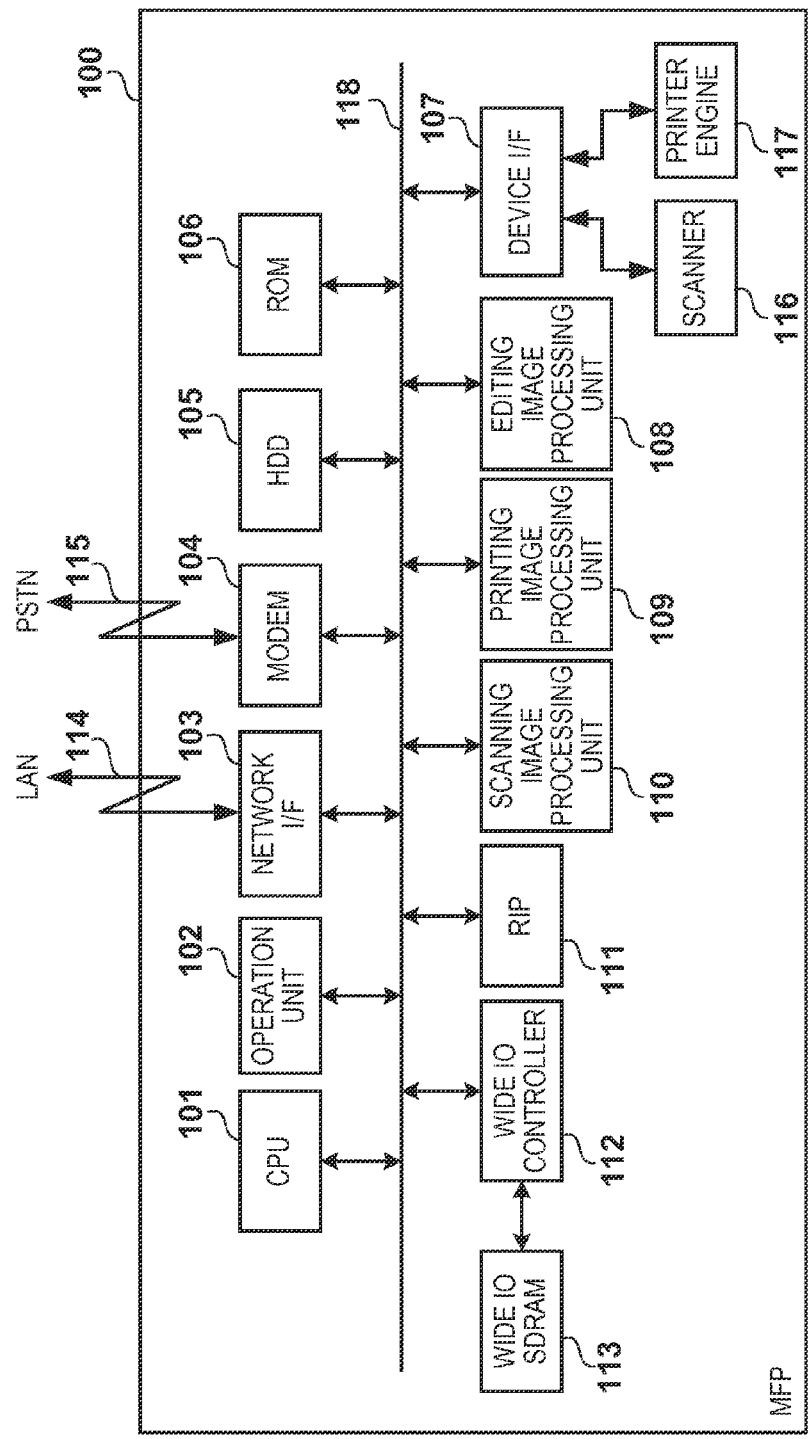
FIG. 1 is a block diagram showing an overall configuration of an MFP (a digital multifunction device) according to a first embodiment.

FIG. 1 is a block diagram showing an overall configuration of an MFP (a digital Multi-Function Peripheral) according no the first embodiment of the present invention.

An MFP 100 has a scanner 116 that is an image input device, and a printer engine 117 that is an image output device, and these are connected to a system bus 118 via a device interface (I/F) 107. The MFP 100 can perform scanning of an original image using the scanner 116, and printing using the printer engine 117, under control of the CPU 101. Also, the MFP 100 is connected to a LAN 114 and a public switched telephone network (PSTN) 115, and can input and output image data and device information regarding an external device connected to the LAN or the PSTN via the LAN 114 and the PSTN 115.

A CPU 101 controls the operation of this MFP 100 by executing a program loaded from an HDD 105 to a wide IO SDRAM 113 by a boot program stored in a ROM 106. An operation unit 102 has an input unit such as a touch panel or a keyboard, and a display unit, and receives instructions from a user, and causes the display unit to display messages, processing results, and the like to the user. The network I/F 103 is realized by a LAN card for example, and performs input/output of device information and image data with external, devices via the LAN 114. A modem 101 performs input/output of control information and image data with external devices via the PSTN 115. The HDD (hard disk drive) 105 stores an OS, various application programs, and the like, and holds input image data and the like. The ROM 106 stores a boot program and various data. The device I/F 107 is connected to the printer engine 117 and the scanner 116, and performs processing for image data transmission with the scanner 116, the printer engine 117, and the system bus 118.

An editing image processing unit 108 performs, on image data, various types of image processing, such as rotation and size adjustment, color processing, trimming/masking, binary conversion, multi-value conversion, and blank sheet determination. The printing image processing unit 109 performs image processing and the like that corresponds to the printer engine 117 on image data to be output to the printer engine 117. The scanning image processing unit 110 performs various types of processing such as correcting, manipulating, and editing on image data input from the scanner 116. The RIP 111 renders page description language (PDL) code into image data.

A wide IO controller 112 converts memory access commands from the CPU 101, the image processing units 108 to 110, and the like into commands that are interpretable by the wide IO SDRAM 113 and accesses the wide IO SDRAM 113. The wide IO SDRAM 113 stores programs to be executed by the CPU 101, and provides a system working memory for the CPU 101 to operate. Additionally, the wide IO-SDRAM 113 is also an image memory for temporarily storing input, image data. As shown in FIG. 1, the system bus 118 connects the aforementioned devices and the CPU 101, and transfers control signals, data, and the like therebetween.

Figure 2A:
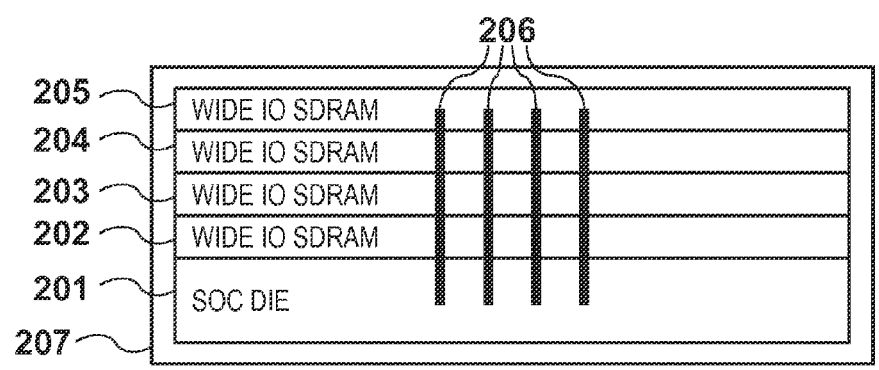
FIGS. 2A and 2B are pattern diagrams showing the structure of a wide IO SDRAM according to the first embodiment.
Figure 2B:
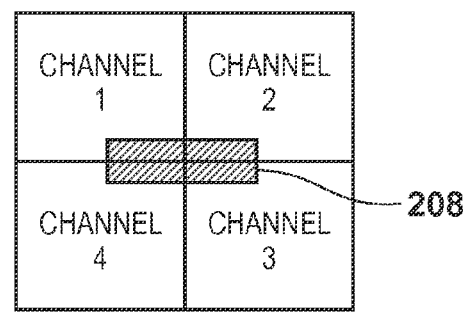

FIGS. 2A and 2B are pattern diagrams showing the structure of the wide IO SDRAM 113 according to the present embodiment, FIG. 2A being a side view of the wide IO SDRAM and an SoC die viewed from the side, and FIG. 2B being a top view.

In the present embodiment, an SoC die 201 includes the CPU 101, the device I/F 107, the RIP 111, the image processing units 108 to 110, and the like. Wide IO SDRAM chips 202 to 205 are stacked over the SoC die 201 and connected to the SoC die 201 by a Through-Silicon Via (TSV) 206. The wide IO SDRAM chips can be stacked in four layers at most, according to the necessary memory capacity, and an example of stacking in four layers is shown in FIG. 2A. An SoC package 207 contains the SoC die 201 and the wide IO SDRAM chips 202 to 205 in one package. As shown in FIG. 2B, the wide IO SDRAM I/F 208 is arranged in the central portion of the SoC die 201 and the wide IO SDRAM chips 202 to 205.

FIG. 3 is a block diagram showing the internal configuration of the wide IO controller 112 according to the present embodiment.

In FIG. 3, the wide IO controller 112 is connected between the system bus 118 and the wide IO SDRAM 113, as shown in FIG. 1. The wide IO controller 112 is connected to temperature sensors 309 to 312, which are not illustrated in FIG. 1.

SDRAMs 301 to 304 are four memories provided in the wide IO SDRAM 113, and each includes a dedicated interface (I/F) as shown in FIG. 3. The dedicated I/Fs correspond to the four channels of the wide IO) SDRAM chips 202 to 205, which are stacked over the SoC die 201 as described above. Also, the dedicated I/Fs correspond to the wide IO SDRAM I/F 208 in FIG. 2B. The memory controllers 305 to 308 can individually control power supply voltage, as well as the supply and termination of clock signals, for the SDRAMs 301 to 304. Each of the memory controllers 305 to 308 accesses a corresponding connected. SDRAM by converting a memory access command from the system bus 118 into a command that is interpretable by the SDRAM. The temperature sensors 309 to 312 measure the temperature of the corresponding SDRAM out of the SDRAMs 301 to 304.

A register I/F 313 receives access from the CPU 101 via a register-dedicated bus (not shown). A register 314 stores temperature information acquired by the temperature acquisition I/F 315 from the temperature sensors 309 to 312, as well as operation mode setting information for the memory controllers 305 to 308, which is set by the CPU 101.

Figure 4:
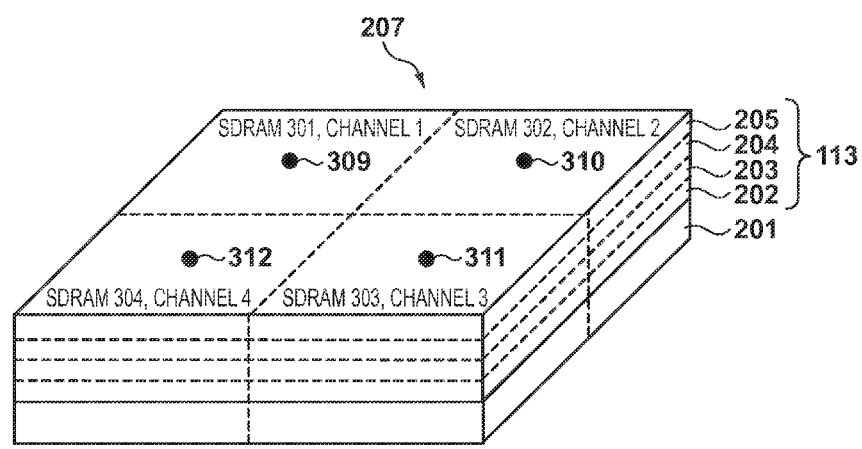
FIG. 4 is an overhead view of an SoC package according to the first embodiment.

FIG. 4 is an overhead view of the SoC package 207 for simplifying the description of the physical positional relationships of the wide IO SDRAM chips 202 to 205 and the SoC die 201 in FIGS. 2A and 2B.

The SoC die 201 includes the CPU 101, the device I/F 107, the RIP 111, the aforementioned image processing units 108 to 110, and the like. The channels (memory channels) 1 to 4 in FIG. 2B correspond to the upper left, upper right, bottom left, and bottom right portions of the plane of the SoC package 207. Also, the four portions similarly correspond to the SDRAMs 301 to 304 in FIG. 3. As described above, the wide IO SDRAM 113 is a memory stacked over the SoC die 201. Additionally, in the present embodiment, the devices in the SDRAMs 301 to 304 are stacked in four layers above the four portions of the SoC die 201, as shown in FIG. 4. The temperature sensors 309 to 312 are built into the devices in the SDRAMs 301 to 304 so that the internal temperature of each memory can be measured. However, this is merely an example, and the arrangement of the SDRAMs and the temperature, sensors is not limited to FIG. 4. Also, the temperature sensors 309 to 312 may be provided within the SoC die 201, or they may be provided within the memory of the wide IO SDRAM 113.

Figure 5:
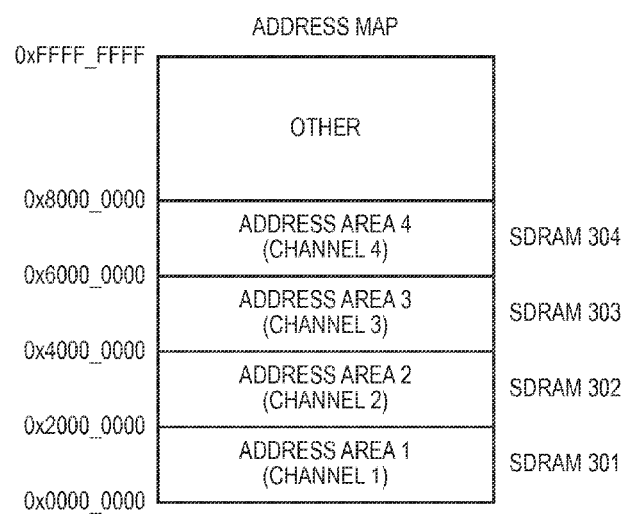
FIG. 5 is a diagram for describing an address map showing address areas allocated to an SDRAM according to the first embodiment.

FIG. 5 is a diagram for describing an address map indicating address areas allocated to the SDRAMs 301 to 304, according to the present embodiment.

In the present embodiment, an address area 1 is allocated to the SDRAM 301, an address area 2 is allocated to the SDRAM 302, an address area 3 is allocated to the SDRAM 303, and an address area 4 is allocated to the SDRAM 304. In other words, channels 1 to 4 in FIG. 4 are allocated to the address areas 1 to 4. However, the sizes of the address areas are not limited to those illustrated in FIG. 5. Note that the aforementioned program of the CPU 101 is loaded to the address area 1 in the SDRAM 301.

FIG. 6 is a diagram showing the positional relationship between the SDRAMs 301 to 304, which configure the wide IO SDRAM 113 according to the present embodiment, and the circuits laid out on the SoC die 102.

As stated above, the SoC die 201 is divided into four areas, and channels 1 to 4 are stacked the four areas. Also, a system circuit 601, a scan circuit 602, a print circuit 603, and an editing circuit 604 are laid out on the SoC die 201 in correspondence with the SDRAMs 301 to 304. Here, the system circuit 601 includes the CPU 101, an I/F circuit for interfacing with the operation unit 102, the wide IO controller 112, the network I/F 103, and the like. The scan circuit 602 includes the scanning image processing unit 110, the modem 104, and the like. The print circuit 603 includes the printing image processing unit 109, the RIP 111, and the like. The editing circuit 604 includes the editing image processing unit 108, the device I/F 107, and the like.

Operations performed by the MFP 100 according to the present embodiment including the above-described configuration will be described below. The MFP 100 has a print function, a scan function, and an image editing function as main functions, and the CPU 101 primarily executes applications for printing and scanning, and applications for editing. Here, a description will be given for a case where the present embodiment is applied to a print application.

Figure 7:
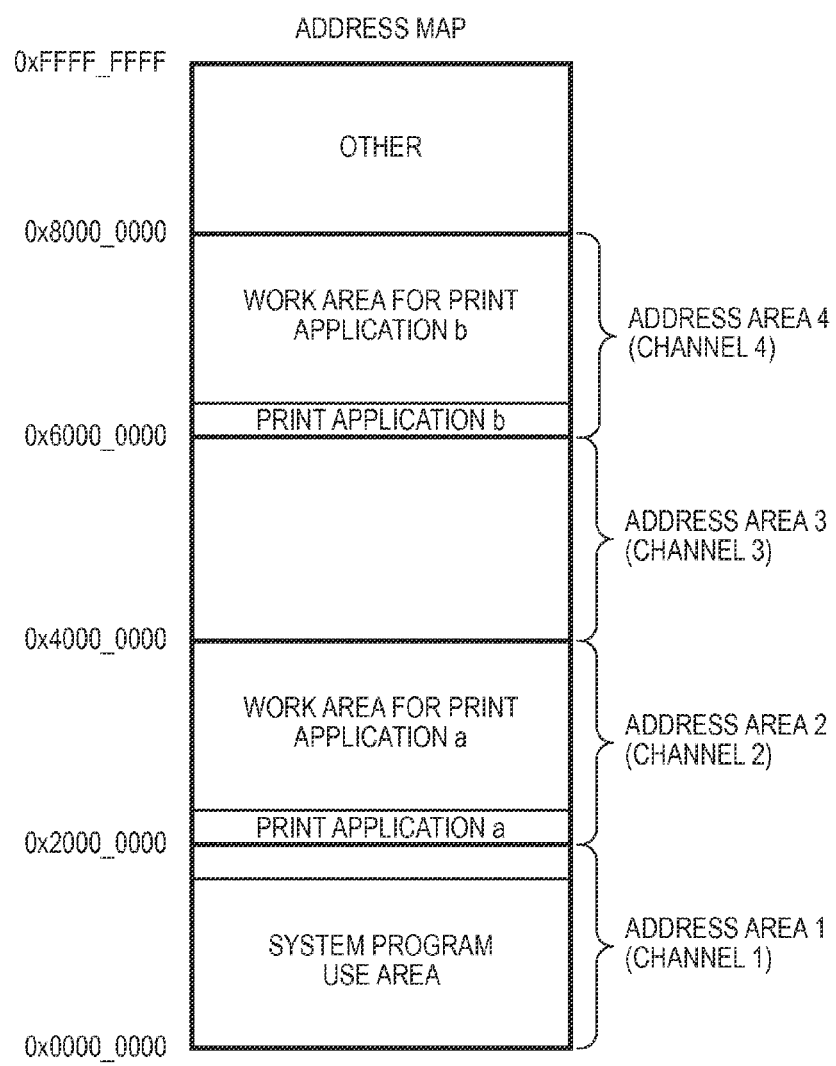
FIG. 7 is a diagram for describing an address map in the case where a print application has been loaded to an SDRAM according to an embodiment.

FIG. 7 is a diagram for describing an address map in the case where a print application has been loaded to the SDRAMs 301 to 304, according to the present embodiment.

In FIG. 7, a print application a is loaded to the address area 2, and a print application b is loaded to the address area 4.

Figure 8:
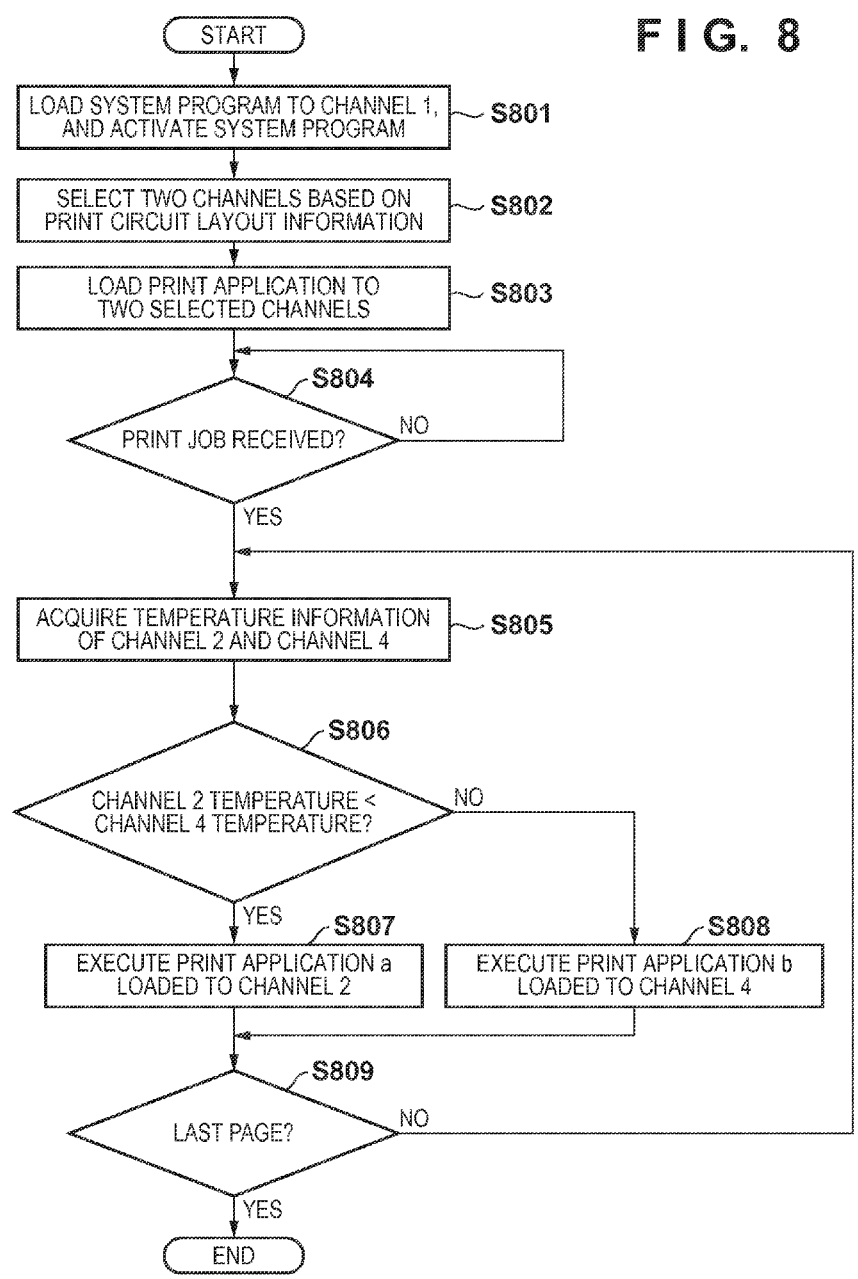
FIG. 8 is a flowchart for describing processing for selecting and executing an application for executing print processing performed by the MFP according to the first embodiment.

FIG. 8 is a flowchart for describing processing for selecting and executing an application for executing print, processing performed by the MFP 100 according to the first embodiment. This processing is realized by the CPU 101 executing a program loaded to the wide IO SDRAM 113.

This processing is started by the MFP 100 being powered on. First, in step S801, the CPU 101 executes the boot program stored in the ROM 106 and loads the system program installed in the HDD 105 to channel 1 of the wide IO SDRAM 113. Here, as shown in FIG. 7, channel 1 is allocated to the addresses 0x00000000 to 0x20000000 in the address space. Then, the CPU 101 activates the system program (OS) that was loaded, and the MFP 100 starts to operate. The above-described processing is similar to the startup sequence used in common by general embedded devices.

Next, the CPU 101 moves the procedure to step S802, and selects two channels among the channels 1 to 4 as areas for executing a print application, using layout information for the address areas shown in FIG. 7. Note that in the present embodiment, two address areas are selected, but it is possible to select two or more address areas. Also, in the present embodiment, the system program is stored in the address area 1, which corresponds to channel 1.

Additionally, when executing a print job, the print circuit 603 in channel 3 is activated, and therefore channel 2 in the address area 2 and channel 4 in the address area 4 that are in the memories other than the memory corresponding to channel 3 in the print circuit 603 are selected as storage destinations for the print application.

In FIG. 7, the print application a is loaded in 0x20000000 to 0x40000000, which correspond to the address area 2. The print application b is loaded in 0x60000000 to 0x80000000, which correspond to the address area 4. These application programs both have the same functions. In addition, the work areas used when these applications are executed are the areas neighboring the respective areas in which the applications are stored. Thus, when the print application a is executed, the application stored in the address area 2 is executed, and a work area in the same address area 2 is used and therefore channel 2 is primarily accessed. Similarly, in the case of executing print application b, channel 4 is primarily accessed.

Thus, in step S802, the CPU 101 selects two address areas, and subsequently moves the procedure to step S803, where the CPU 101 loads a print application to each address area. FIG. 7 shows a state in which the print applications have been loaded in such a manner.

Next, the CPU 101 moves the procedure to step S804, where it determines whether or not a print job has been received from the network I/F 103 or the operation unit 102. In this embodiment, the applications are executed by a job that corresponds to the function of the application being input. When a print job has been received, the procedure moves to step S805, and the CPU 101 acquires temperature information of channel 2 and channel 4, to which the print application has been loaded. Here, the CPU 101 acquires the temperature information detected by the temperature sensor 310 for channel 2, and by the temperature sensor 312 for channel 4.

Then, the CPU 101 moves the procedure to step S806, where as compares the temperatures of channel 2 and channel 4 and executes the print application that was loaded to the memory channel having the lower temperature. That is to say, in step S806, the CPU 101 determines whether or not the temperature of channel 2 is lower than the temperature of channel 4, and if it is, the procedure moves to step S807, and the CPU 101 executes the print application a, which was loaded to channel 2. On the other hand, when the temperature of channel 4 is lower than the temperature of channel 2, the procedure moves to step S808, and the CPU 101 executes the print application b, which was loaded to channel 4. Thus, when step S807 or S808 is executed, the procedure moves to step S809, the CPU 101 completes one page worth of printing, determines whether or not that was the final page, and if there is a next page, the procedure moves to step S805, and the CPU 101 acquires the temperature information of the memory channels once again. Then, in steps S806 to S808, the CPU 101 selects the print application that is to be executed, and executes the application to perform printing.

Note that in the above description, the acquisition of the temperature of a memory channel and the re-selection of a channel for execution of an application are performed in units of pages. However, in order to reduce overhead for the acquisition of temperature information and the switching of applications, it is not necessary to perform this processing for each page, and temperature information acquisition may be performed every time a predetermined number of pages are printed, or every time a predetermined time has elapsed, for example.

As described above, according to the first embodiment, an application can be executed using a memory area having a lower temperature among memory areas in a wide IO memory device, and therefore it is possible to suppress memory temperature increases caused by executing an application.

Also, in the first embodiment, since applications having the same functions can be stored in separate memory channels, selected, and executed, it is possible to switch applications instantaneously in accordance with the temperature of the memory channels.

Second Embodiment

Next, a second embodiment of the present invention will be described. When using multiple areas for storing an application program for one job, for every job to be executed by an MFP 100, the application program for executing that job is doubly loaded to two channels, for example. Furthermore, work areas are reserved for these channels. This doubles the amount of necessary memory resources compared to the conventional technology. In consideration of this, it is possible to doubly load only applications that correspond to jobs having a high execution frequency, or to jobs whose execution is accompanied by large temperature increases. Additionally, when there is little free space in the memory, it is possible to reduce the number of doubly-loaded applications.

In the second embodiment, an example will be described in which an application to be doubly-loaded is decided upon in accordance with the amount of free memory space, in the MFP 100 that has a print function, a scan function, and an editing function. Note that the hardware configuration of the MFP according to the second embodiment is the same as that in the above-described first embodiment, and therefore the description thereof will not be repeated.

FIG. 9A is a diagram showing an example of arranging a scan application, a print, application, and an editing application in a memory, in the case where there are three available channels.

In FIG. 9A, a print application is loaded to channel 2 and channel 4, similarly to FIG. 7 in the first embodiment. Since the scan circuit 602 is arranged in channel 2 (FIG. 6), the scan applications are loaded to channel 3 and channel 4, bypassing the corresponding address area 2. The scan application a is loaded to the address area 3, and the scan application b is loaded to the address area 4. Also, since the editing circuit 604 is arranged in channel 4 (FIG. 6), the editing applications are loaded to channel 2 and channel 3, bypassing the corresponding address area 4. The editing application a is loaded to the address area 2, and the editing application b is loaded to the address area 3.

FIG. 9B is a diagram showing an example in which a scan application, a print application, and an editing application are arranged in a memory, in the case where there are two available channels.

In FIG. 9B, since the print circuit 603 is arranged in channel 3 (FIG. 6), the print application is loaded to channel 4 only. Since the scan circuit 602 is arranged in channel 2 (FIG. 6), the scan application is loaded to the available, channels 3 and 4. The scan application a is loaded to the address area 3, and the scan application b is loaded to the address area 4. Additionally, since the editing circuit 604 is arranged in channel 4 (FIG. 6), the editing application is loaded to channel 3 only.

Figure 10A:
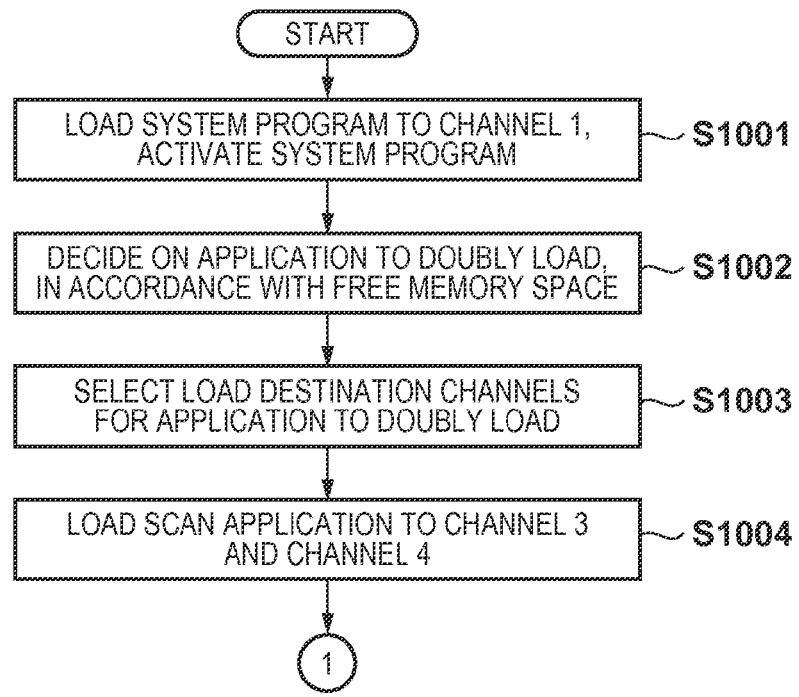
FIGS. 10A and 10B are flowcharts for describing processing for selecting and executing an application for executing printing, scanning, and editing processing performed by an MFP 100 according to a second embodiment.
Figure 10B:
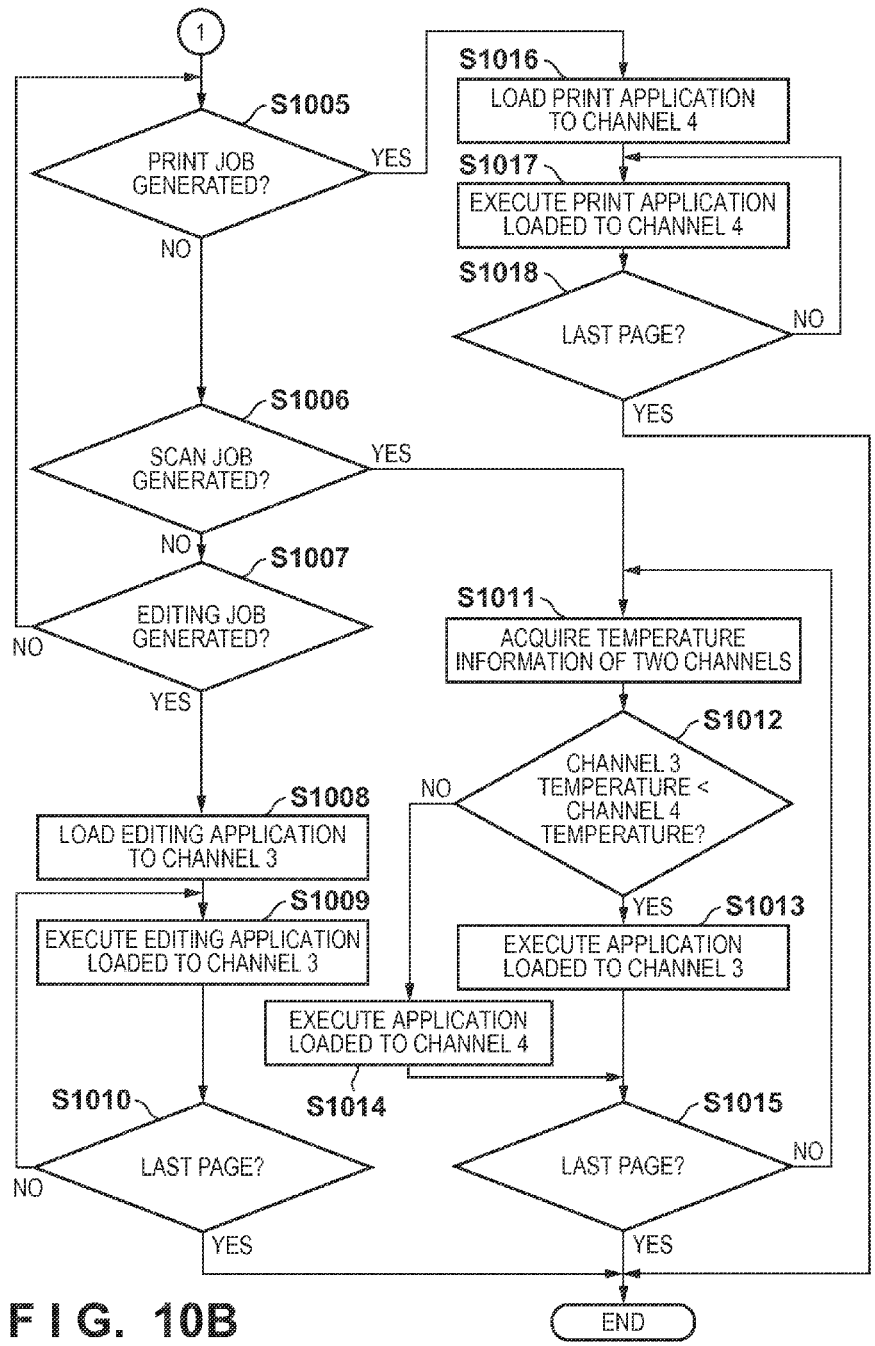

FIGS. 10A and 10B are flowcharts for describing processing for selecting and executing an application for executing printing, scanning, and editing processing performed by the MFP 100 of the second embodiment. This processing is realized by the CPU 101 executing a program loaded to the wide IO SDRAM 113.

This processing is started by the MFP 100 being powered on. First, in step S1001, the CPU 101 executes the boot program stored in the ROM 106, and loads the system program installed in the HDD 105 to channel 1 of the wide IO SDRAM 113. As shown in FIG. 7, channel 1 is allocated to the addresses 0x00000000 to 0x20000000 in the address space. Then, the CPU 101 activates the system program (OS) that was loaded, and the MFP 100 starts to operate. The above-described processing is similar to a startup sequence used in common by general embedded devices. Next, the CPU 101 moves the procedure to step S1002, and decides on the application that is to be doubly loaded, in accordance with the amount of free memory space, the application use frequency, temperature increases that accompany the execution of applications, and the like. Next, the CPU 101 moves the procedure to step S1003, and selects a load destination for the application based on the layout information of the processing circuit that corresponds to the function. That is to say, based on the arrangement of the memory channels and circuits such as those shown in FIG. 6, for example, the scan application is arranged bypassing channel 2. Accordingly, the scan application is doubly loaded to channel 3 and channel 4.

Note that the flowcharts in FIGS. 10A and 10B show the case where there are two available channels in the memory, and in step S1004, the applications are arranged as shown in FIG. 9B. Note that although the scan application is doubly loaded in FIG. 9B, the present invention is not limited to this.

After the scan application is loaded in this way, the procedure moves to step S1005, and the CPU 101 determines whether or not a print job has been generated. If a print job has been generated, the procedure moves to step S1016, and if a print job has not been generated, the procedure moves to step S1006. In step S1016, the CPU 101 loads the print application related to the print job to the address area 4 (channel 4) that are in the channel other than channel 3. Then, in step S1017, the CPU 101 executes the print application that was loaded, and processes the print job. Then, in step S1018, the CPU 101 executes print processing until reaching the final page, and when the printing of the final page ends, the processing ends.

In step S1006, the CPU 101 determines whether or not a scan job has been generated. If a scan job has been generated, the procedure moves to step S1011, and if a scan job has not been generated, the procedure moves to step S1007. In step S1011, the CPU 101 acquires the temperature information of channels 3 and 4 and executes the scan application loaded to the channel having the lower temperature. That is to say, in step S1011, the CPU 101 acquires the temperature information of channel 3 and channel 4 and, step S1012, compares the temperature of channel 3 and the temperature of channel 4. If the temperature of channel 3 is lower than the temperature of channel 4, the procedure moves to step S1013, and the CPU 101 executes the scan application loaded to channel 3. On the other hand, in step S1012, if the temperature of channel 4 is lower than the temperature of channel 3, the procedure moves to step S1014, and the CPU 101 executes the scan application loaded to channel 4. When step S1013 or step S1014 is thus executed, the procedure moves to step S1015, the CPU 101 determines whether or not the page that was scanned is the final page, and if it is, the processing ends, and if it is not, the procedure moves to step S1011 and the above-described processing is executed.

Additionally, in step S1007, the CPU 101 determines whether or not an editing job has been generated. If an editing to has been generated, the procedure moves to step S1008, and if it has not been generated, the procedure moves to step S1005. In step S1008, the CPU 101 loads the editing application to the address area 3 (channel 3) that are in the channel other than channel 4, and in step S1009, the CPU 101 executes the editing application that was loaded, and processes the editing job. Then, in step S1010, the CPU 101 executes editing processing up to the last page, and when the editing of the final page ends, the processing ends.

Note that if there are three available channels, the print application, the scan application, and the editing application are doubly loaded to the memory channels in step S1004 in FIG. 10A, as shown in FIG. 9A. Then, when the corresponding jobs are generated, the application loaded to the channel having the lower temperature is selected similarly to steps S1011 and S1012 in FIG. 10B, and the application is executed.

As described above, according to the second embodiment, it is possible to reduce the amount of memory space consumed by applications, by selecting an application to be doubly loaded in accordance with whether or not there is a predetermined amount of available space in the channels.

In addition, for example, it is possible to suppress temperature increases caused by executing an application, by doubly loading only applications corresponding to jobs having a high execution frequency, or to jobs whose execution is accompanied by large temperature increases. Also, by doubly loading an application that is frequently executed, the time leading up to the execution of the application can be shortened.

As described above, according to the present embodiment, it is possible to execute an application loaded to a memory channel having a lower temperature for each predetermined unit of processing in a job being executed. By doing so, the number of localized areas of high temperatures in a memory that occur over time can be reduced, and the DRAM refresh frequency and leak current can be reduced. Also, according to this, it is possible to reduce power consumption, and to suppress decreases in wide IO DRAM access performance to the greatest extent possible.

Other Embodiments

Aspects of the present invention can also be realized by a computer of a system or apparatus (or devices such as a CPU or MPU) that reads out and executes a program recorded on a memory device to perform the functions of the above-described embodiments, and by a method, the steps of which are performed, by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-225367, filed Oct. 10, 2012 which is hereby incorporated by reference herein in its entirety.

What is claimed is:

1. An information processing apparatus comprising:
a wide IO memory device stacked on an SoC die that includes a CPU;
a loading unit configured to load a specified application from among a plurality of applications for executing separate functions, to a plurality of memories included in the wide IO memory device, excluding a memory positioned above a circuit on the SoC die relating to the function executed by the application;
a temperature acquisition unit configured to, upon the execution of the application loaded by the loading unit being instructed, acquire temperature information of the plurality of memories included in the wide IO memory device; and
a control unit configured to perform control so as to execute the application loaded to a memory having a lower temperature acquired by the temperature acquisition unit.

2. The information processing apparatus according to claim 1, further comprising a deciding unit configured to decide on the specified application that is to be loaded to the plurality of memories by the loading unit,
wherein the loading unit loads the application decided on by the deciding unit to the plurality of memories.

3. The information processing apparatus according to claim 2, wherein the deciding unit decides on the application that is to be loaded to the plurality of memories, in accordance with amounts of free space in the plurality of memories.

4. The information processing apparatus according to claim 2, wherein the deciding unit decides on one of an application corresponding to a job having a high execution frequency and an application corresponding to a job whose execution is accompanied by a large temperature increase, to be the application that is to be loaded to the plurality of memories.

5. The information processing apparatus according to claim 1, wherein the wide IO memory device is configured by a plurality of memory channels, and the plurality of memories are arranged in the memory channels.

6. The information processing apparatus according to claim 5, wherein a plurality of circuits corresponding to separate functions are arranged on the SoC die, and the memory channels of the wide IO memory device are arranged on the circuits.

7. The information processing apparatus according to claim 1, wherein
- the plurality of memories each have a temperature sensor that detects temperature, and
- the temperature acquisition unit acquires the temperature information of the plurality of memories based on the temperature detected by the temperature sensors.

8. The information processing apparatus according to claim 1, wherein the execution of the function is instructed by a job input to the information processing apparatus.

9. The information processing apparatus according to claim 1, wherein the control unit performs control such that one of for every unit of information that is processed by the execution of the application and for every predetermined period of time, the temperature acquisition unit acquires the temperature information, and the application loaded to a memory having a lower temperature is executed.

10. The information processing apparatus according to claim 9, wherein the unit of information is one page-worth of information.

11. A control method of controlling an information processing apparatus including a wide IO memory device stacked on an SoC die that includes a CPU, the method comprising:
- loading a specified application from among a plurality of applications for executing separate functions, to a plurality of memories included in the wide IO memory device, excluding a memory positioned above a circuit on the SoC die relating to the function for executing the application;
- upon the execution of the application loaded in the loading step being instructed, acquiring temperature information of the plurality of memories included in the wide IO memory device; and
- performing control so as to execute the application loaded to a memory having a lower temperature acquired in the acquiring step.

12. A non-transitory computer-readable storage medium storing a computer program for causing a computer to execute a control method of controlling an information processing apparatus including a wide IO memory device stacked on an SoC die that includes a CPU, the method comprising:
- loading a specified application from among a plurality of applications for executing separate functions, to a plurality of memories included in the wide IO memory device, excluding a memory positioned above a circuit on the SoC die relating to the function for executing the application;
- upon the execution of the application loaded in the loading step being instructed, acquiring temperature information of the plurality of memories included in the wide IO memory device; and
- performing control so as to execute the application loaded to a memory having a lower temperature acquired in the acquiring step.

* * * * *